(12) United States Patent
Nakamura

(10) Patent No.: US 6,507,248 B2
(45) Date of Patent: Jan. 14, 2003

(54) VOLTAGE-CONTROLLED CRYSTAL OSCILLATOR

(75) Inventor: Rikoku Nakamura, Nishitokyo (JP)

(73) Assignee: Citizen Watch Co., Ltd., Tokyo (JP)

( * ) Notice: Subject to any disclaimer, the term of this patent is extended or adjusted under 35 U.S.C. 154(b) by 36 days.

(21) Appl. No.: 09/864,157

(22) Filed: May 25, 2001

(65) Prior Publication Data

US 2001/0045869 A1 Nov. 29, 2001

(30) Foreign Application Priority Data

May 29, 2000 (JP) ........................................ 2000-157550

(51) Int. Cl.[7] ............................... H03B 5/32; H03B 5/36
(52) U.S. Cl. .................... 331/158; 331/105; 331/108 C; 331/116 R; 331/175; 331/177 V
(58) Field of Search ................................ 331/36 C, 105, 331/108 C, 108 D, 116 R, 116 FE, 119 R, 117 FE, 117 D, 158, 175, 177 V

(56) References Cited

U.S. PATENT DOCUMENTS

| | | | |
|---|---|---|---|
| 3,636,420 A | * | 1/1972 | Vendelin et al. ............. 317/234 |
| 3,911,378 A | * | 10/1975 | Buchanan ................ 331/116 R |
| 4,851,792 A | * | 7/1989 | Ochiai et al. ................ 331/176 |
| 4,949,055 A | * | 8/1990 | Leitl ........................... 331/158 |
| 5,051,373 A | * | 9/1991 | Yamada et al. ................. 437/8 |

FOREIGN PATENT DOCUMENTS

JP        4-212507        8/1992

* cited by examiner

Primary Examiner—David C. Mis
(74) Attorney, Agent, or Firm—Finnegan, Henderson, Farabow, Garrett & Dunner, L.L.P.

(57) ABSTRACT

Disclosed is an integrated voltage-controlled crystal oscillator intended to present the conditions for circuit constants in an oscillator circuit that can improve the oscillator's frequency tuning range with respect to the variable capacitance range of a variable-capacitance element. The voltage-controlled crystal oscillator comprises a crystal, an amplifier, and a load capacitor, wherein the load capacitor includes a voltage-controlled variable-capacitance element integrated on a semiconductor substrate and a DC cut capacitor element connected in series with the voltage-controlled variable-capacitance element, and the DC cut capacitor element has a capacitance value (Ccut) whose ratio to a maximum capacitance value (Cvmax) of the voltage-controlled variable-capacitance element (Ccut/Cvmax) is more than 0.5 and not more than 10.

8 Claims, 14 Drawing Sheets

VOLTAGE-CONTROLLED CRYSTAL OSCILLATOR

BACKGROUND OF THE INVENTION

1. Field of the Invention

The present invention relates to a crystal oscillator circuit having a variable-capacitance element whose capacitance value can be controlled by a voltage to adjust the oscillator output frequency.

2. Description of the Related Art

Crystal oscillator circuits utilizing crystals offer enormous advantages in practical applications, since the crystals exhibit extremely high frequency stability, have an excellent temperature characteristic, and are easy to manufacture. Because of these advantages, crystal oscillators constructed as single packages by incorporating crystals into oscillator circuits, and capable of producing a desired-clock frequency by just applying a prescribed voltage, have been used widely in recent years.

In the field of electrical communications, etc., to maintain synchronization between a plurality of signals, or to synchronize a system clock to a transmission carrier wave, the frequency of the crystal oscillator must be made tunable within a certain range. To tune the oscillation frequency of the crystal oscillator, it is commonly practiced to use a variable-capacitance element as a load capacitor for the crystal. A varicap, and the like, with a capacitance which can vary with an applied DC voltage is used as the variable-capacitance element. A crystal oscillator having such a function is specifically called a voltage-controlled crystal oscillator.

FIG. 1(a) shows one configuration example of a voltage-controlled crystal oscillator circuit according to the prior art, and FIG. 1(b) shows a two-terminal equivalent circuit of a crystal. In FIG. 1(a), reference numeral 1 is the crystal, 2 is an inverting amplifier, 3 is an input terminal of the oscillator circuit, 4 is an output terminal of the oscillator circuit, 5 is a buffer amplifier, 6 and 7 are control voltage application terminals, R is a resistor, Cv is a variable-capacitance element, Ccut is a DC cut capacitor element and Cp1 and Cp2 are possible parasitic capacitors. For actual operation of the circuit, a suitable bias voltage must be applied to the input terminal 3 of the oscillator circuit. In the figure, it is assumed that the bias voltage application means is included in the inverting amplifier 2. In FIG. 1(b), C0, L1, C1, and R1 are equivalent circuit constants for the crystal: C0 represents an equivalent parallel capacitance, L1 an equivalent series inductance, C1 an equivalent series capacitance, and R1 an equivalent series resistance.

FIG. 2 is a cross-sectional view showing an integrated load capacitor portion (at one side) when the voltage-controlled crystal oscillator circuit shown in FIG. 1(a) is implemented in integrated circuit form. In FIG. 2, reference numeral 10 indicates a silicon substrate and 11–14 represents a varicap, i e., the variable-capacitance element, integrated on the substrate. Here, reference numeral 11 indicates a lightly doped diffusion layer called the p-well, 12 a highly doped diffusion layer called the p+ region, 13 a highly doped diffusion layer called the n+ region, and 14 a depletion layer. The highly doped diffusion layer 12 is at ground potential. Further, reference numeral 15 designates a field oxide film formed on the surface of the substrate, and 16–18 represents the DC cut capacitor element, having two polysilicon layers, formed on top of the field oxide film 15. Here, reference numerals 16 and 17 are polysilicon films as electrode films, and 18 is an insulating layer. Further, reference numeral 19 indicates a metal wiring line which connects the DC cut capacitor element in series with the variable-capacitance element and also connects to the resistor R (FIG. 1(a)). The control voltage is applied to the variable-capacitance element 11–14 via the resistor R (FIG. 1(a)) and via the metal wiring line 19. The depth of the depletion layer 14 varies with the magnitude of this control voltage, causing the capacitance value (the capacitance between the n+ region and the p+ region) of the variable-capacitance element to change. The upper electrode 17 of the DC cut capacitor element is connected to the input terminal 3 (FIG. 1(a)) or the output terminal 4 (FIG. 1(a)) via a metal wiring line (not shown). Dashed line 20 indicates a metal wiring line for the reverse connection described later in this specification. For the reverse connection, the metal wiring line indicated by the dashed line 20 is formed in place of the metal wiring line 19. Further, in the case of the reverse connection, the lower electrode 16 of the DC cut capacitor element is connected to the input terminal 3 (FIG. 1(a)) or the output terminal 4 (FIG. 1(a)) via a metal wiring line (not shown).

SUMMARY OF THE INVENTION

The frequency of a voltage-controlled crystal oscillator must be tunable within a user requested range, while ensuring output signal stability. The user requested frequency tuning range varies depending on the application of the oscillator. It is therefore desirable that the frequency tuning range be made as wide as possible so that the same voltage-controlled crystal oscillator can be used in a wide variety of applications.

The frequency tuning range has a strong positive correlation with the capacitance variable range of the load capacitor. Therefore, making the capacitance variable range of the load capacitor as wide as possible is the most important requirement for improving the frequency tuning range. In view of this, attention must be paid to the relationship between the DC cut capacitor element and the variable-capacitance element. The load capacitance value of the voltage-controlled crystal oscillator is the sum of the capacitances of the DC cut capacitor element and variable-capacitance element connected in series. Therefore, if maximum use is to be made of the variation in the capacitance of the variable-capacitance element to vary the load capacitance, it is desirable that the fixed capacitance value of the DC cut capacitor element be made as large as possible.

Before crystal oscillator circuits of integrated circuit form were commercially implemented, discrete component elements were used for the variable-capacitance element and DC cut capacitor that provide the load capacitance. The value of each individual element could be chosen freely and independently of the others. Based on this concept, the capacitance value Ccut of the DC cut capacitor was chosen to be sufficiently larger, usually more than 10 times larger, than the maximum capacitance value Cvmax of the variable-capacitance element. Even after crystal oscillator circuits of integrated circuit form were introduced in recent years, the above concept has been followed without questioning its validity, and the Ccut/Cvmax ratio of more than 10 times larger has been taken for granted and used in circuit design. However, the inventor questioned the viability of this traditional concept and sought room for an improvement in the crystal oscillators.

An object of the present invention is to present, in a crystal oscillator constructed using an integrated crystal oscillator circuit, circuit design conditions for the oscillator circuit that can improve the oscillator's frequency tuning range with respect to the capacitance variable range of the variable-capacitance element, compared with that achieved with the prior art. More specifically, an object of the invention is to define the range of Ccut/Cvmax values that can improve the oscillator frequency tuning range and to present effective circuit design conditions for improving the oscillator frequency tuning range.

To attain the above object, the voltage-controlled crystal oscillator of the present invention has the following feature.

(1) A voltage-controlled crystal oscillator comprising a crystal, an amplifier, and a load capacitor, wherein the load capacitor includes a voltage-controlled variable-capacitance element integrated on a semiconductor substrate and a DC cut capacitor element connected in series with the voltage-controlled variable-capacitance element, and the DC cut capacitor element has a capacitance value (Ccut) whose ratio to a maximum capacitance value (Cvmax) of the voltage-controlled variable-capacitance element (Ccut/Cvmax) is more than 0.5 and not more than 10.

Further, it is preferable that the voltage-controlled crystal oscillator of the present invention has at least one.of the following features.

(2) The ratio (Ccut/Cvmax) is more than 0.5 and not more than 4.0.

(3) The ratio (Ccut/Cvmax) is more than 0.7 and not more than 1.8

(4) The maximum capacitance value (Cvmax) of the voltage-controlled variable-capacitance element is more than 15 pF and not more than 50 pF.

DETAILED DESCRIPTION OF THE INVENTION

The electrode film (the polysilicon film 16 in FIG. 2) of the integrated DC cut capacitor element invariably has a parasitic capacitance (stray capacitance) Cp2 to the semiconductor substrate, and the parasitic capacitance value is substantially proportional to the area occupied by the electrode film. From this, the inventor deduced that if the DC cut capacitor element was designed to have a large capacitance value, a parasitic capacitance Cp2, having a large fixed capacitance, would be formed in parallel with the variable-capacitance element Cv, which would in turn reduce the frequency changing effect of the variable-capacitance element. There is also the phenomenon that the amount of change in the frequency for the amount of change in the load capacitance (the effect that the amount of change in the capacitance has on the frequency) decreases as the load capacitance increases. It can therefore be inferred that when integrating the circuit, if the size of the DC cut capacitor element was reduced compared with the prior art to suppress the formation of the parasitic capacitance, an excellent effect could be obtained in increasing the frequency changing effect.

Based on this inference, a mathematical equation expressing the change of the oscillator frequency was clearly defined. Next, based on the mathematical equation expressing the change of the oscillator frequency, a simulation was performed by varying various circuit constants in the oscillator circuit. In the simulation, the oscillator frequency tuning range was obtained by numerical calculation. The mathematical equations used are shown below. In the embodiment of the present invention, the structure shown in FIG. 2 is used for the integrated DC cut capacitor element and voltage-controlled variable-capacitance element, and the circuit configuration shown in FIG. 1 is used for the oscillator circuit.

The change of the oscillation frequency in the voltage-controlled crystal oscillator is expressed by equation (1), and the value of the load capacitance by equation (2).

$$\Delta f/fS = 1 + C0/[2\gamma^*(C0+CL)] \ldots (1)$$

$$2CL = Cp1 + Ccut^*(CV+Cp2)/(Ccut+CV+Cp2) \ldots (2)$$

where fS is the series resonance frequency of the crystal, CL is the load capacitance, and $\Delta f/fS$ is the rate of change of the frequency.

In the simulation, circuit constants considered standard were set as standard values, and by varying one constant at a time above and below its standard value, the load capacitance and the rate of change of the frequency, $\Delta f/fS$, were calculated using the equations (2) and (1), respectively. Graphs were constructed by plotting the Ccut/Cv ratio along the abscissa with a scale of 1 to 12 and the frequency tuning range (defined as the difference between $\Delta f/fS$ for Cvmax and $\Delta f/fS$ for Cvmin) along the ordinate in units of ppm. The other circuit constant that was varied was used as a parameter.

Figure 1A:
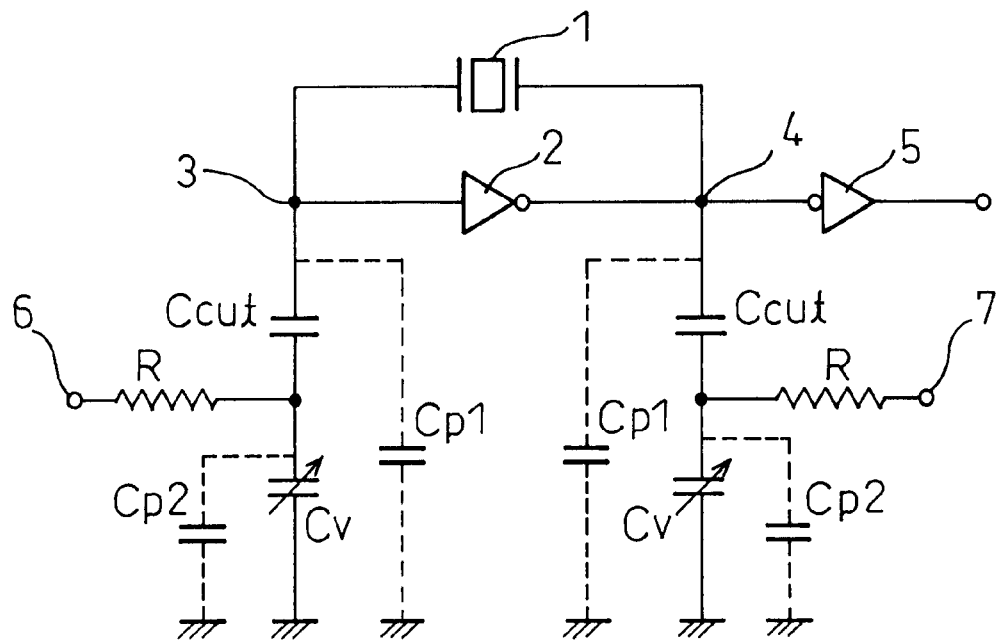
FIG. 1(a) shows one example of a crystal oscillator circuit, which is also used in an embodiment of the present invention.
Figure 1B:
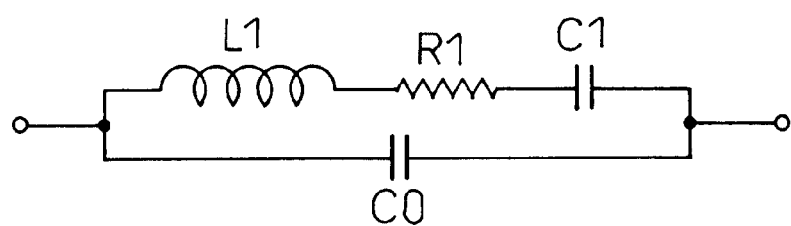
FIG. 1(b) shows a two-terminal equivalent circuit of a crystal.
Figure 2:
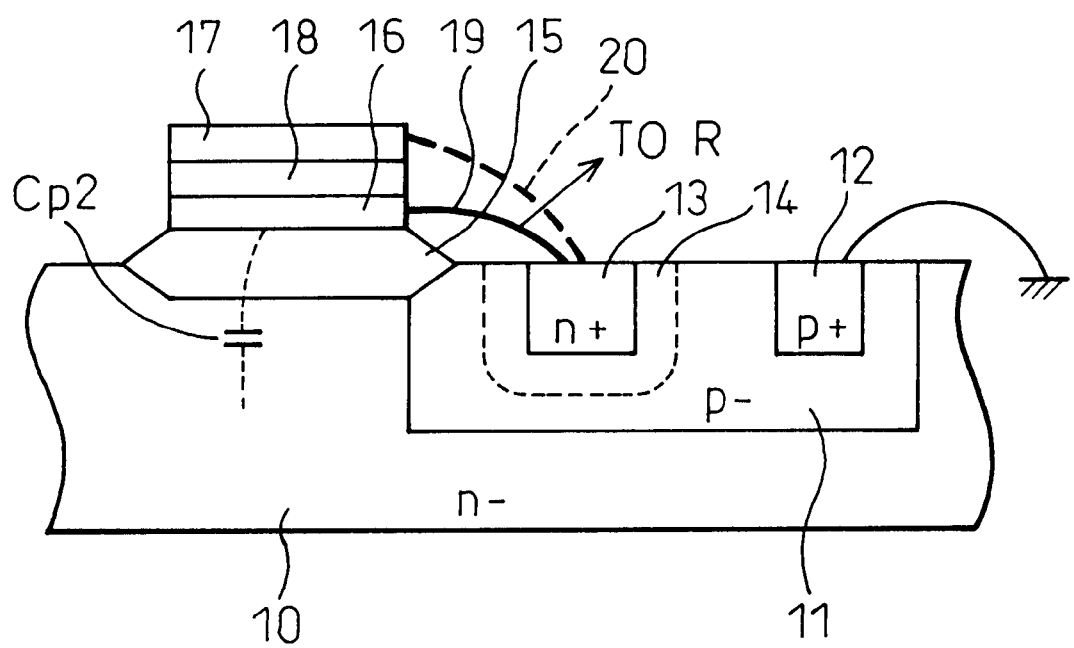
FIG. 2 shows one example of a cross section of a load capacitor portion of an integrated crystal oscillator circuit, which is also used in the embodiment of the present invention.

The oscillator circuit of FIG. 1(a) includes Cv and Ccut at both the input and the output sides. In the simulation described hereinafter, it is assumed that the load capacitors at both sides (the input and output sides) have the same structure and characteristic, and that the variable capacitance at each side is varied over its full range, except the cases of FIGS. 11 and 12 where circuit asymmetry was particularly studied. Standard conditions were Cvmax=30 pF, Cvmin=3 pF, Cp1=3 pF, Cp2=7% of Ccut, C0=3 pF, and $\gamma$(C0/C1)=280.

The results of the simulation will be illustrated below. Each individual calculation will not be described here of the curves shown in each figure, at least one curve represents the result for the standard conditions.

Figure 3:
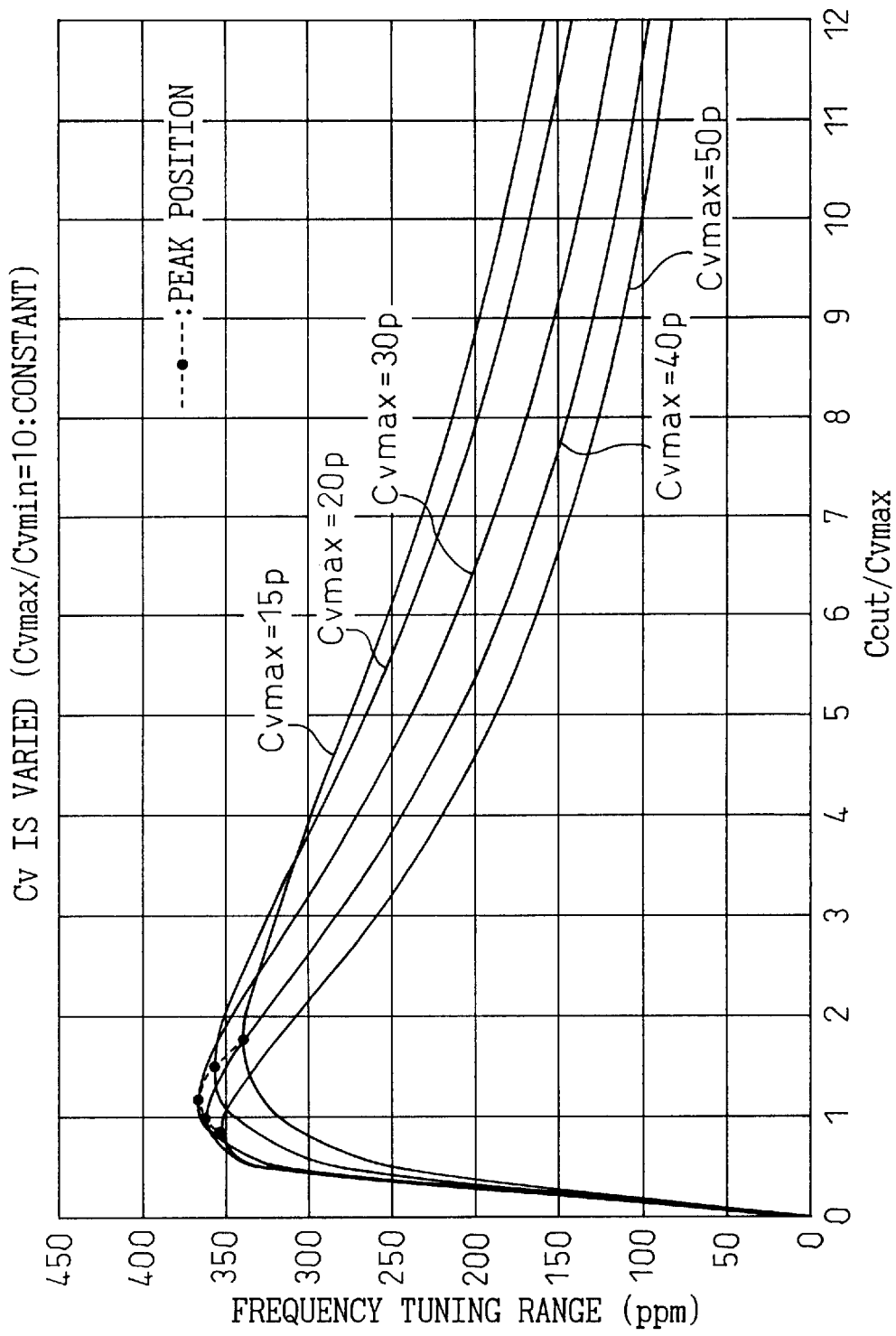
FIG. 3 is a graph showing the frequency tuning range of the crystal oscillator circuit as a function of the ratio Ccut/Cvmax when the size of a variable-capacitance element is varied as a parameter while the ratio of maximum value Cmax to minimum value Cmin of the variable capacitance is held constant.

FIG. 3 is a graph showing the relationship between the frequency tuning range (ppm) and the Ccut/Cvmax ratio when the maximum capacitance value Cvmax of the variable-capacitance element was varied as a parameter. In FIG. 3, the maximum capacitance value Cvmax of the variable-capacitance element was varied between five different values. In each case, the minimum capacitance value Cvmin was set at 10% of Cvmax. The peaks of the respective curves were joined by a dotted line to depict the variation of the peak position. This also applies to the other graphs hereinafter described.

As shown in FIG. 3, the general shape of the curve does not change much even if the value of Cvmax is changed. Further, on any curve, the frequency tuning range is very narrow when Ccut/Cvmax is set to more than 10 as in the prior art. Besides, on each curve, the peak of the frequency tuning range lies within the range of Ccut/Cvmax ratios of 0.8 to 1.6, a range of values smaller, by far, than would be expected in the prior art.

Figure 4:
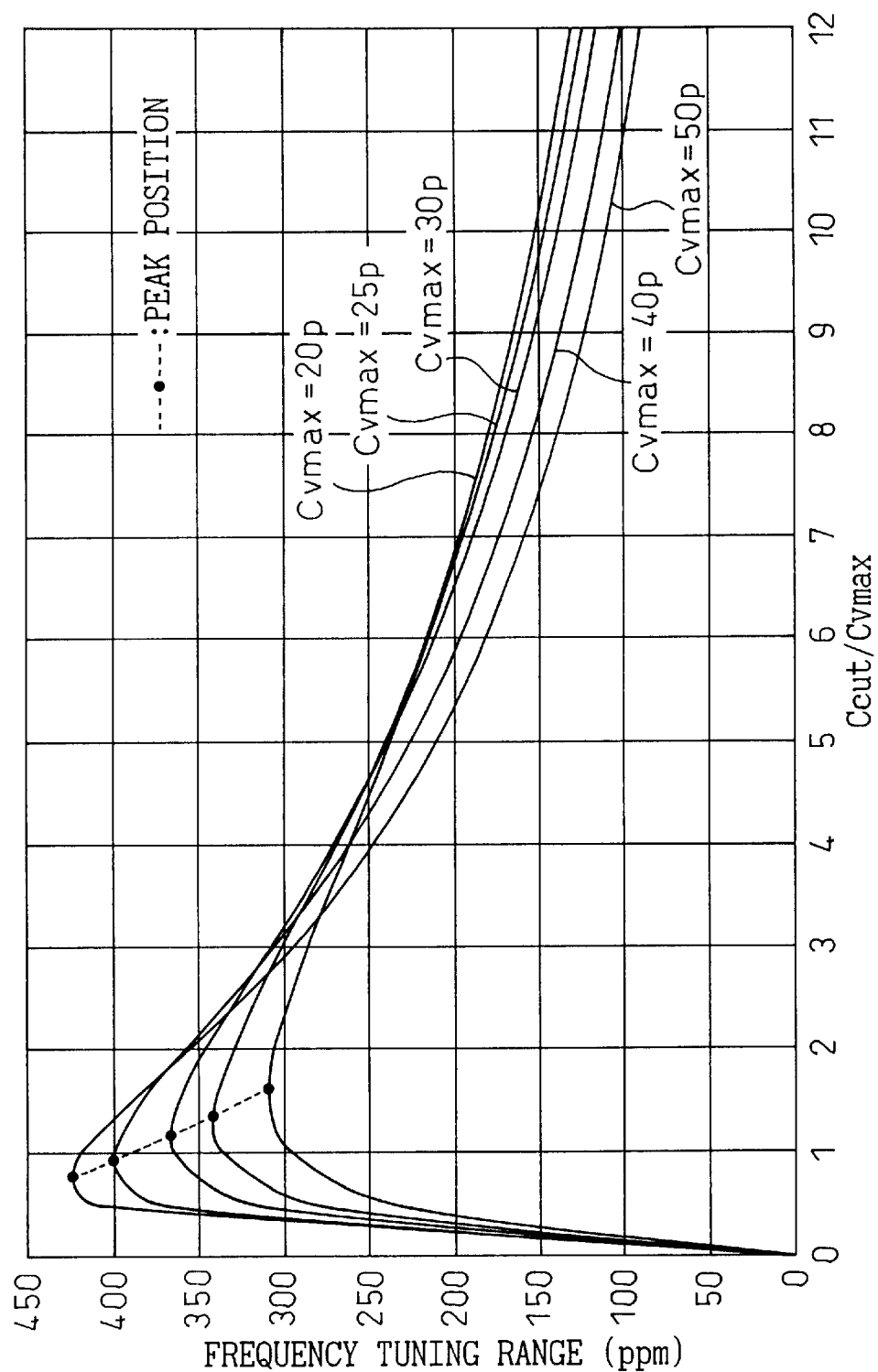
FIG. 4 is a graph showing the frequency tuning range of the crystal oscillator circuit as a function of the ratio Ccut/Cvmax when the size of the variable-capacitance element is varied as a parameter while the maximum value Cmax of the variable capacitance is held constant.

FIG. 4 is a graph showing the relationship between the frequency tuning range (ppm) and the Ccut/Cvmax ratio when the maximum capacitance value Cvmax of the variable-capacitance element was varied as a parameter, as in FIG. 3. In this case, however, the value of Cvmin was fixed to 3.0 pF. As shown in FIG. 4, the general shape of the curve does not change much even if the value of Cvmax is changed. Further, on each curve, the peak of the frequency tuning range appears when the Ccut/Cvmax ratio is in the range of 0.7 to 1.7. The characteristic of this graph is that, as the value of Ccut/Cvmax increases, the relationship between the larger and smaller values of Cvmax is reversed in terms of the value of the frequency tuning range. This is a good example that explains the great influence of the parasitic capacitance Cp2 on the frequency tuning range.

Figure 5:
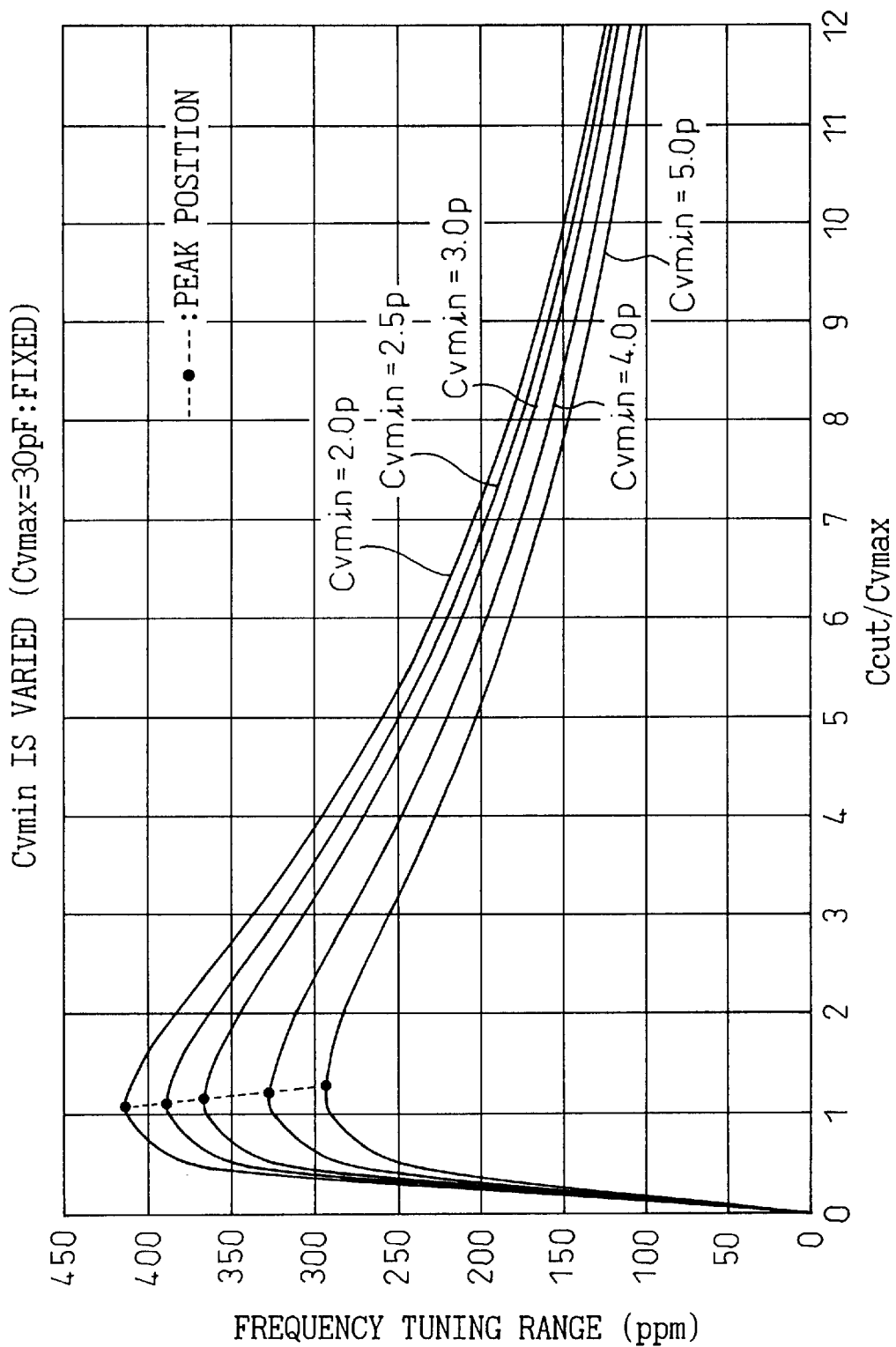
FIG. 5 is a graph showing the frequency tuning range of the crystal oscillator circuit as a function of the ratio Ccut/Cvmax when the minimum value Cmin of the variable capacitance is varied as a parameter.

FIG. 5 is a graph showing the relationship between the frequency tuning range (ppm) and the Ccut/Cvmax ratio when the minimum capacitance value Cvmin of the variable-capacitance element was varied as a parameter. Here, the value of Cvmax was fixed to 30 pF, and Cvmin was varied over the range of 2.0 pF to 5.0 pF. In FIG. 5, the curves are well aligned in shape, and the displacement of the peak position along the abscissa is small. On each curve, the peak of the frequency tuning range appears when the Ccut/Cvmax ratio is in the range of 1.1 to 1.4.

Figure 6:
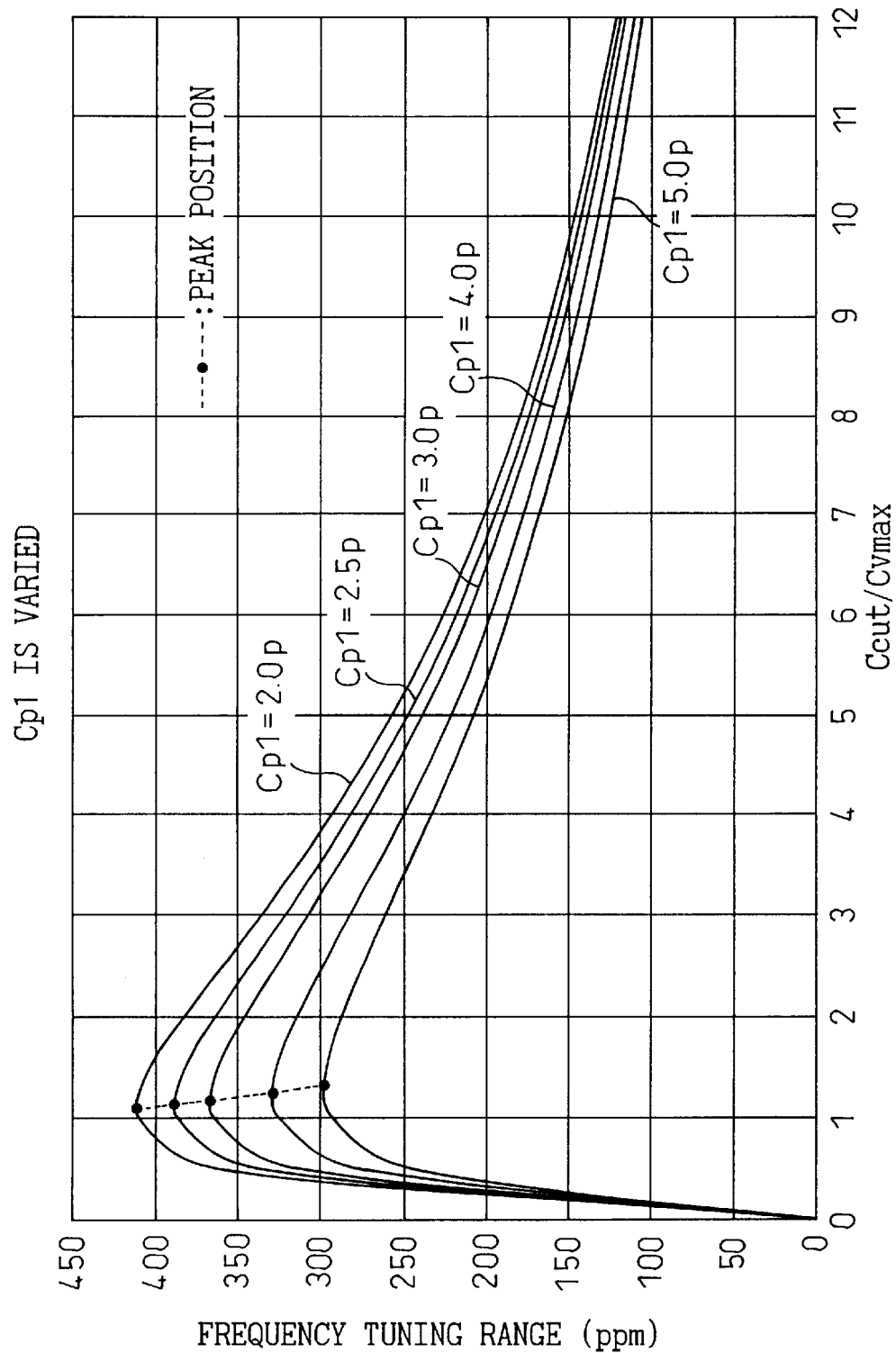
FIG. 6 is a graph showing the frequency tuning range of the crystal oscillator circuit as a function of the ratio Ccut/Cvmax when the magnitude of parasitic capacitance Cp1 is varied as a parameter.

FIG. 6 is a graph showing the relationship between the frequency tuning range (ppm) and the Ccut/Cvmax ratio when the parasitic capacitance Cp1 was varied as a parameter. Here, the parasitic capacitance Cp1 was varied over the range of 2.0 pF to 5.0 pF. The parasitic capacitance Cp1 is the sum of the gate capacitance of the amplifier and stray capacitances on the connection pads of the crystal, interconnections, etc. and, because it bypasses the series capacitance of Ccut and Cv, it acts to reduce the frequency tuning range. On each curve, the peak of the frequency tuning range appears when the Ccut/Cvmax ratio is in the range of 1.1 to 1.4.

Figure 7:
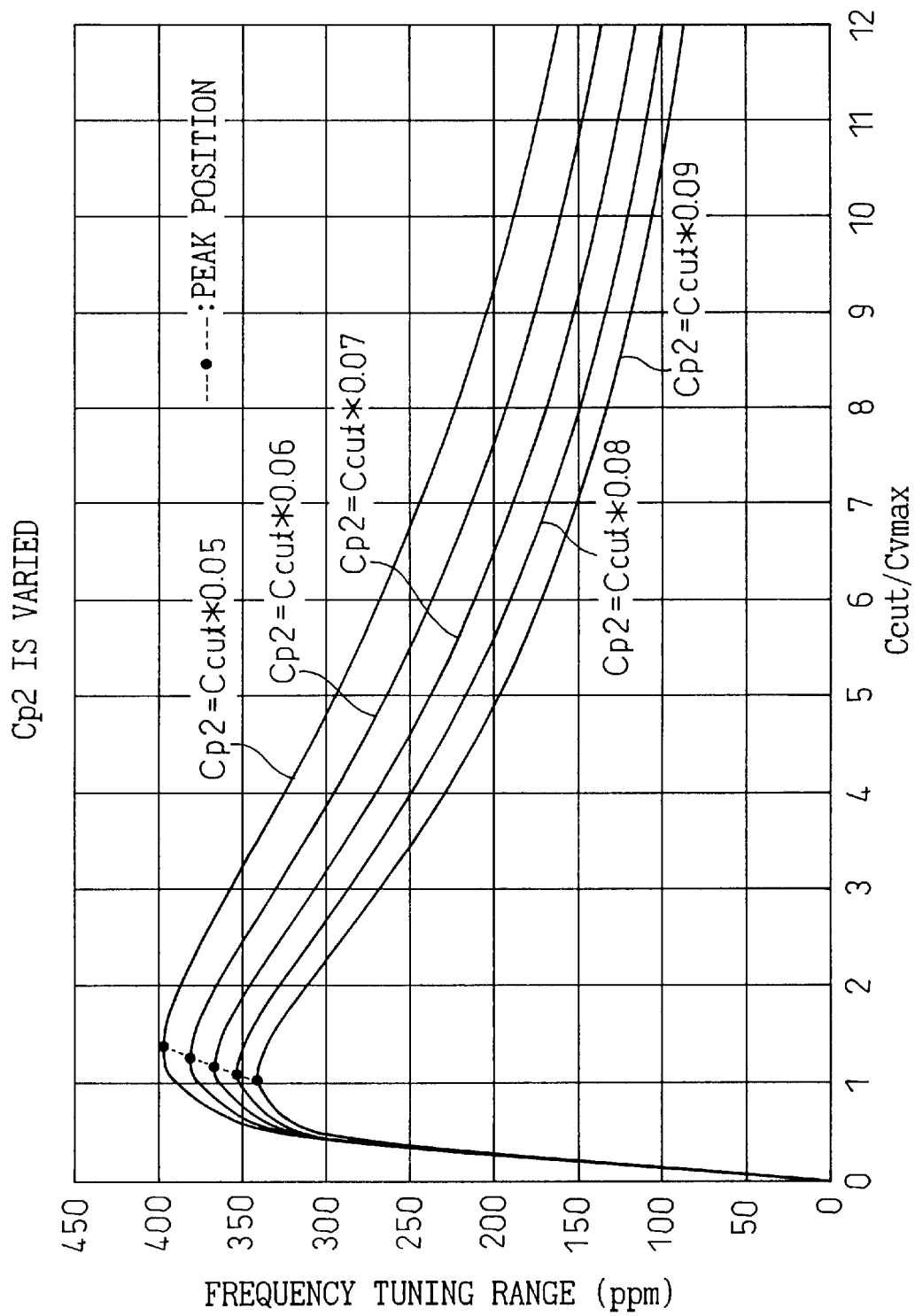
FIG. 7 is a graph showing the frequency tuning range of the crystal oscillator circuit as a function of the ratio Ccut/Cvmax when the magnitude of parasitic capacitance Cp2 is varied as a parameter.

FIG. 7 is a graph showing the relationship between the frequency tuning range (ppm) and the Ccut/Cvmax ratio when the parasitic capacitance Cp2 was varied as a parameter. Here, the parasitic capacitance Cp2 was varied over the range of 5% to 9% of the DC cut capacitance Ccut. As shown in FIG. 2, the parasitic capacitance Cp2 consists primarily of the capacitance between the electrode of Ccut and the silicon substrate 10. Therefore, it is proportional to the size of the area the electrode of Ccut if the cross-sectional structure of the IC is the same. Further, since Cp2 directly bypasses Cv, its influence on the shape of the curve is large. On each curve, the peak of the frequency tuning range appears when the Ccut/Cvmax ratio is in the range of 1.0 to 1.3. The influence of Cp2 is larger at larger values of Ccut/Cvmax (that is, at larger values of Ccut). More specifically, in the region where the value of Ccut/Cvmax is large, the effect of reducing the absolute value of the frequency tuning range is particularly large and, as can be seen, an extremely large influence in the negative direction was in fact observed in the region used in the prior art (the region where the value of Ccut/Cvmax is more than 10).

Figure 8:
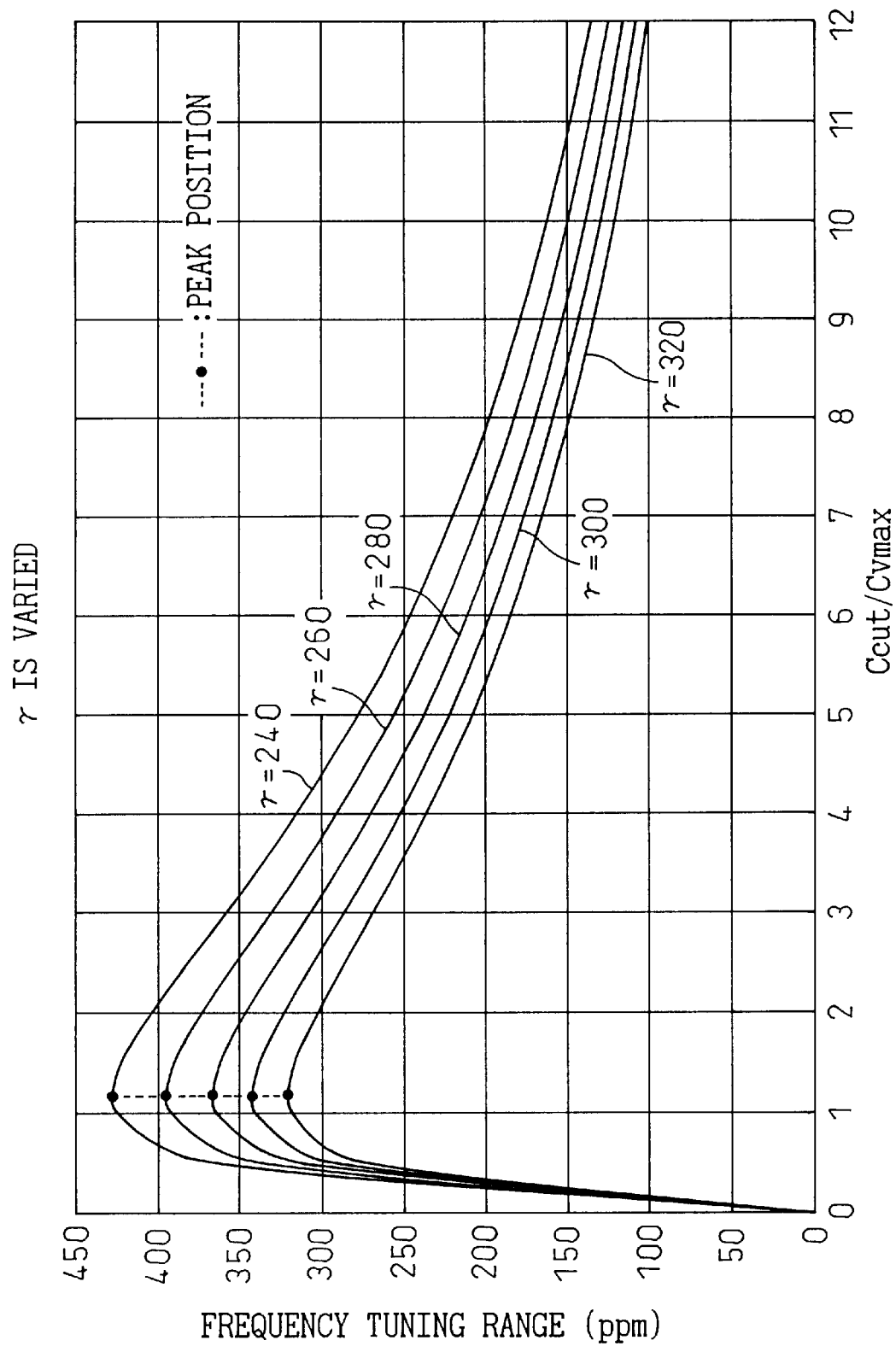
FIG. 8 is a graph showing the frequency tuning range of the crystal oscillator circuit as a function of the ratio Ccut/Cvmax when the ratio γ of equivalent parallel capacitance to equivalent series capacitance of the crystal is varied as a parameter.

FIG. 8 is a graph showing the relationship between the frequency tuning range (ppm) and the Ccut/Cvmax ratio when y was varied as a parameter. Here, $\gamma$ is the ratio of the equivalent parallel capacitance C0 to the equivalent series capacitance C1 of the crystal. The general shape of the curve is very similar to that in other graphs. On each curve, the peak of the frequency tuning range is at the Ccut/Cvmax of 1.17, and is unchanged relative to $\gamma$ (actually, relative to C1 since C0 is fixed in this example).

Figure 9:
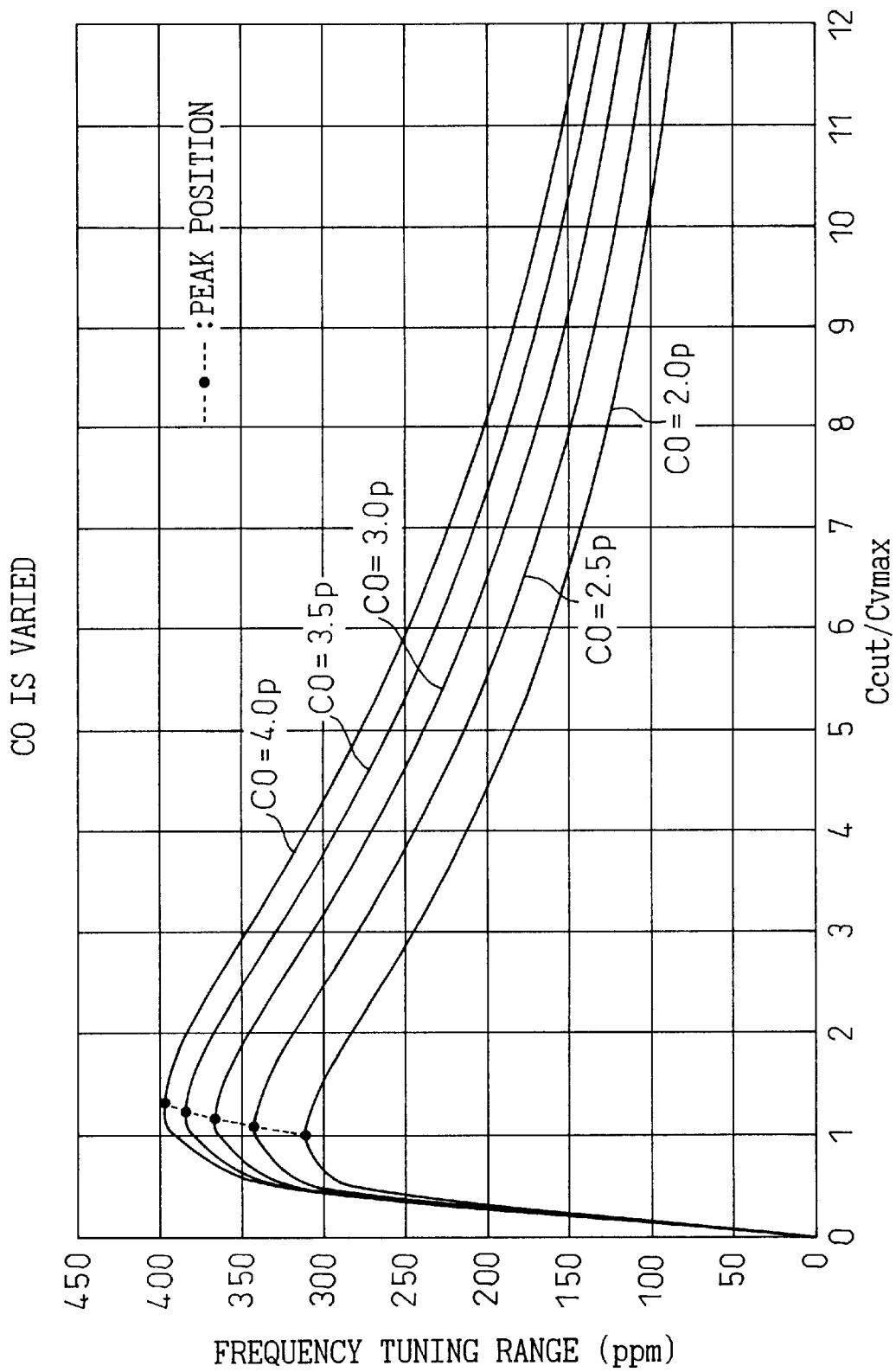
FIG. 9 is a graph showing the frequency tuning range of the crystal oscillator circuit as a function of the ratio Ccut/Cvmax when the magnitude of the parallel capacitance C0 of the crystal is varied as a parameter.

FIG. 9 is a graph showing the relationship between the frequency tuning range (ppm) and the Ccut/Cvmax ratio when the parallel capacitance C0 was varied as a parameter. The general shape of the curve is very similar to that in other graphs. The peak position on each curve as well as the shape of the curve is also very similar to that in other graphs. On each curve, the peak of the frequency tuning range appears when the Ccut/Cvmax ratio is in the range of 0.9 to 1.3.

Figure 10:
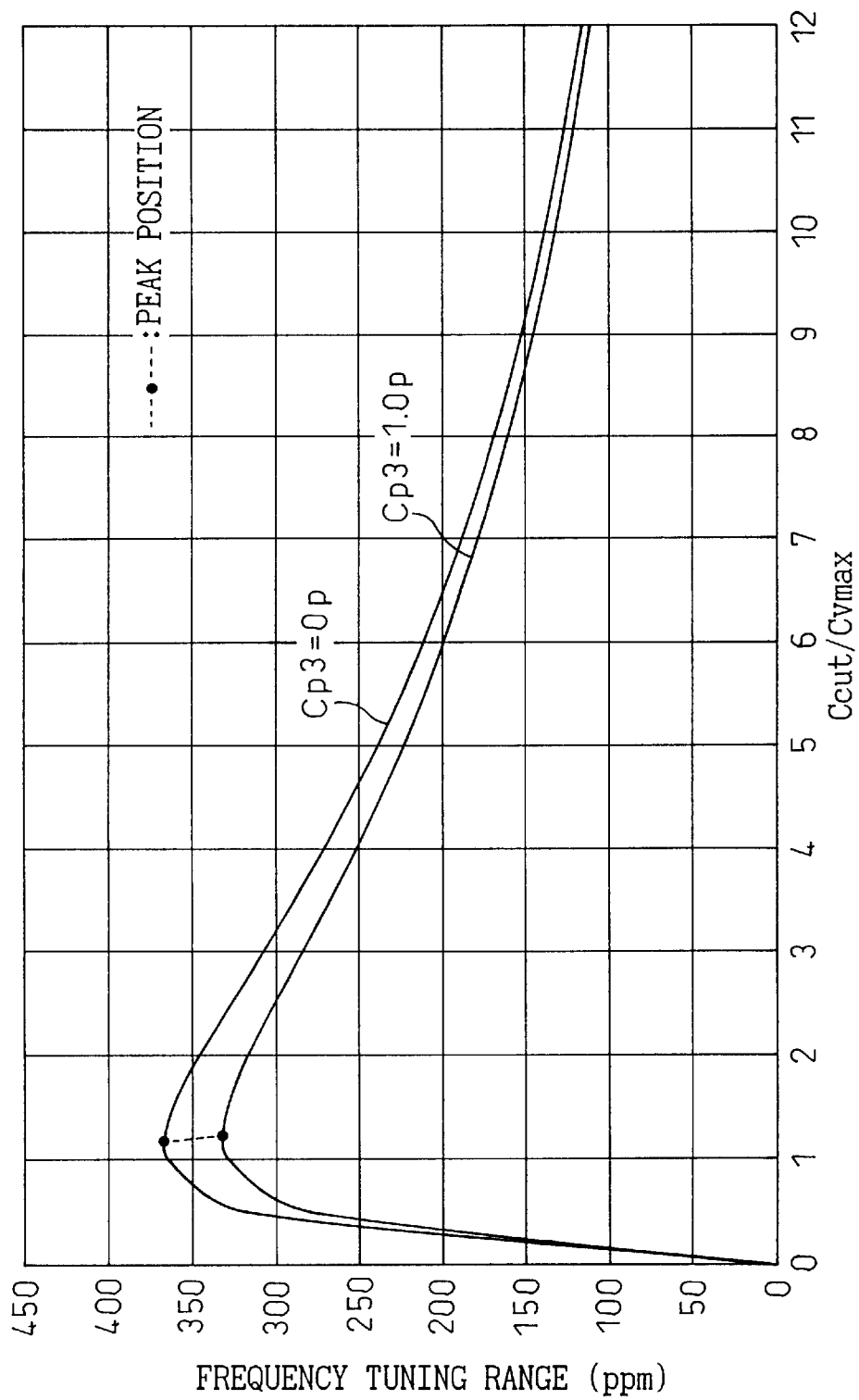
FIG. 10 is a graph showing the frequency tuning range of the crystal oscillator circuit as a function of the ratio Ccut/Cvmax, depicting how the frequency tuning range is affected by the presence or absence of fixed parasitic capacitance Cp3 associated with interconnections.

FIG. 10 is a graph showing the relationship between the frequency tuning range (ppm) and the Ccut/Cvmax ratio when Cp3 was varied as a parameter. Here, Cp3 was varied between two values, 1.9 pF and 0 pF. Cp3 is defined as a fixed (not proportional to Ccut) parasitic capacitance added in parallel at the same position as Cp2 in FIG. 1(a), and consists primarily of a very small stray capacitance associated with the Ccut-Cv-R connections. When Cp3 is considered, the frequency tuning range decreases as a matter of course, but the amount of decrease is very small and does not significantly affect the general shape of the curve.

Figure 11:
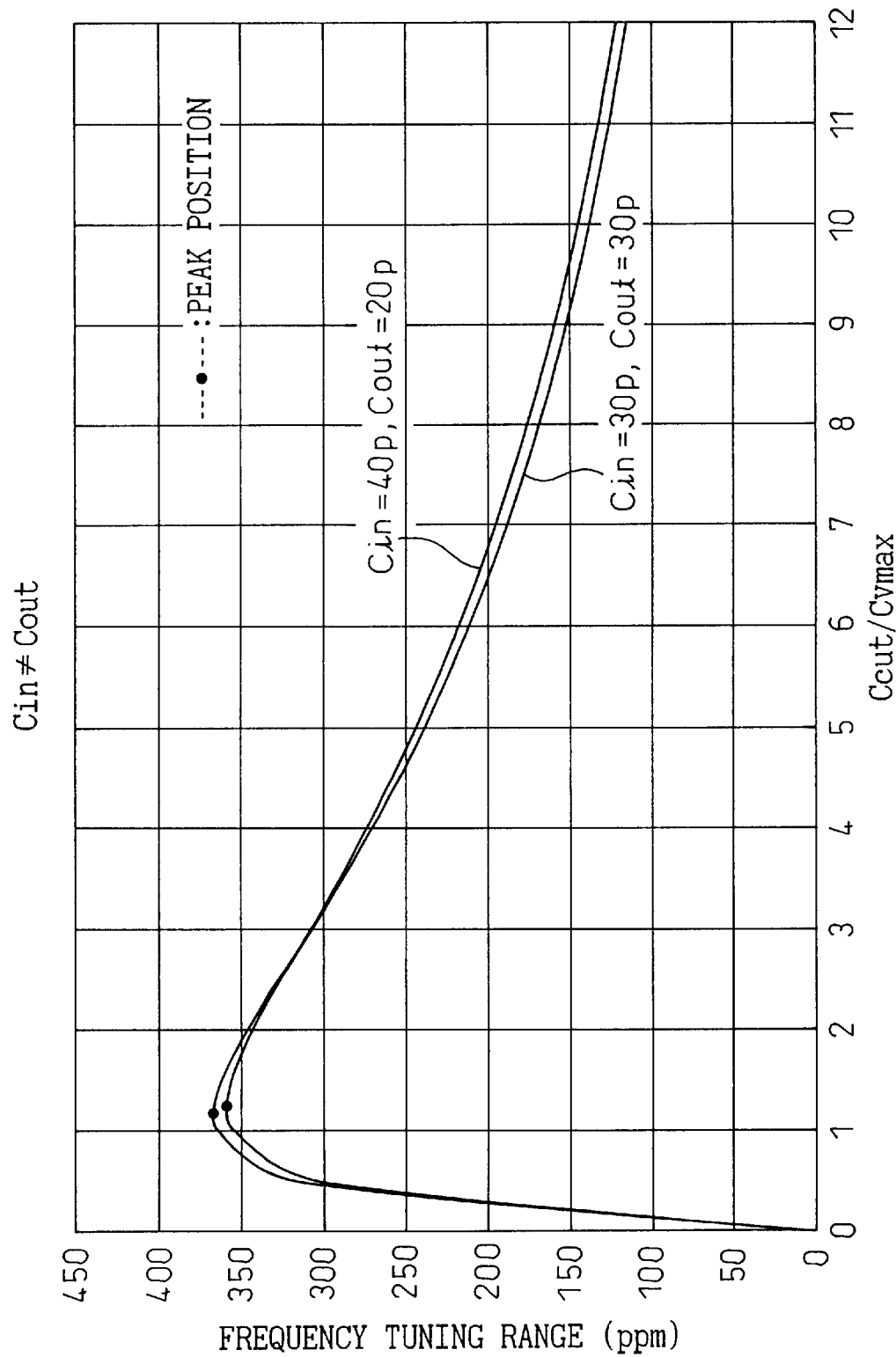
FIG. 11 is a graph showing the frequency tuning range of the crystal oscillator circuit as a function of the ratio Ccut/Cvmax when the magnitude of the variable capacitance differs between the input and output sides of the oscillator circuit.

FIG. 11 is a graph showing the characteristic when the maximum capacitance value of the variable-capacitance element was made different between the input side and output side of the oscillator circuit, in comparison with the characteristic when the standard conditions were employed (the variable-capacitance elements at both the input and output sides were chosen to have the same Cvmax=30 pF). Here, the Cvmax of one variable-capacitance element was set to 40 pF, and the Cvmax of the other to 20 pF. The results show that when the circuit was made asymmetrical between the input and output sides, very little difference was observed between the two curves in terms of the shape, though one curve moved above the other after a point near Ccut/Cvmax=2.7.

Figure 12:
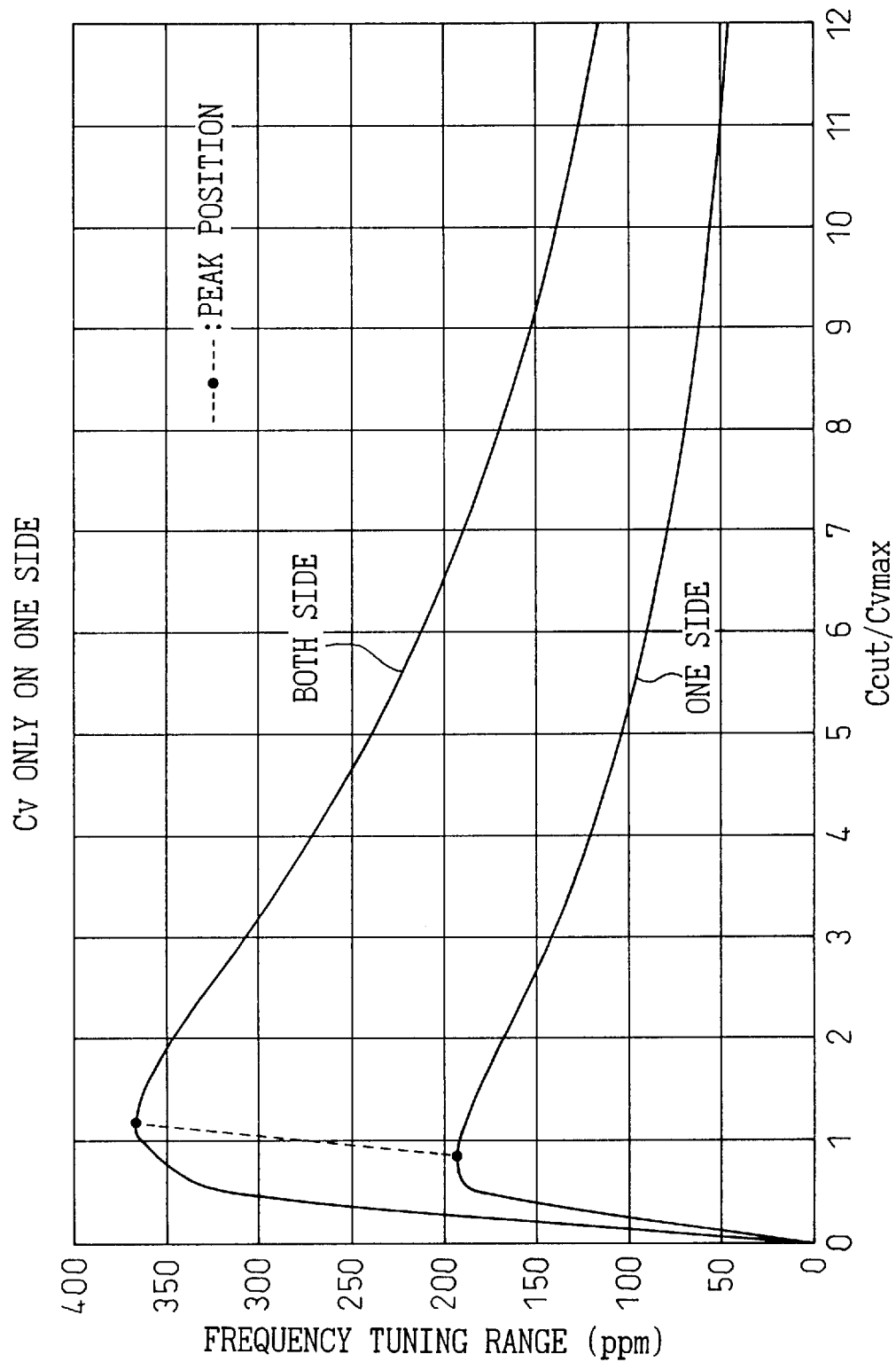
FIG. 12 is a graph showing the frequency tuning range of the crystal oscillator circuit as a function of the ratio Ccut/Cvmax, comparing the characteristic when the variable-capacitance element is provided only at one of the input and output sides of the oscillator circuit with the characteristic when the variable-capacitance element is provided on each side.

FIG. 12 is a graph showing the characteristic when the variable-capacitance element was provided only at one of the input and output sides of the oscillator circuit and a fixed-capacitance element was provided at the other side, in comparison with the characteristic when the standard conditions were employed (the variable-capacitance element was provided at both side). Here, the variable-capacitance element at the one side was chosen to have the same value as defined in the standard conditions, and the fixed-capacitance element at the other side was set to have a capacitance value of 10 pF. When the variable-capacitance element is provided only at one side, the absolute value of the variable-capacitance element is reduced by half. However, the general shape of the curve and the position of the peak of the curve, when the variable-capacitance element is provided only at one side, are similar to those when the variable-capacitance element is provided at both side. Here, for comparison purposes, a simulation was performed for the case where the variable-capacitance element was provided only at one side. However, when fabricating an oscillator by integrating it on a single chip, if the variable-capacitance element was provided only at one side, that would not lead to a reduction in the number of components. Therefore, the circuit configuration having a narrow frequency tuning range by providing the variable-capacitance element only at one side would be seldom used in practice.

Figure 13:
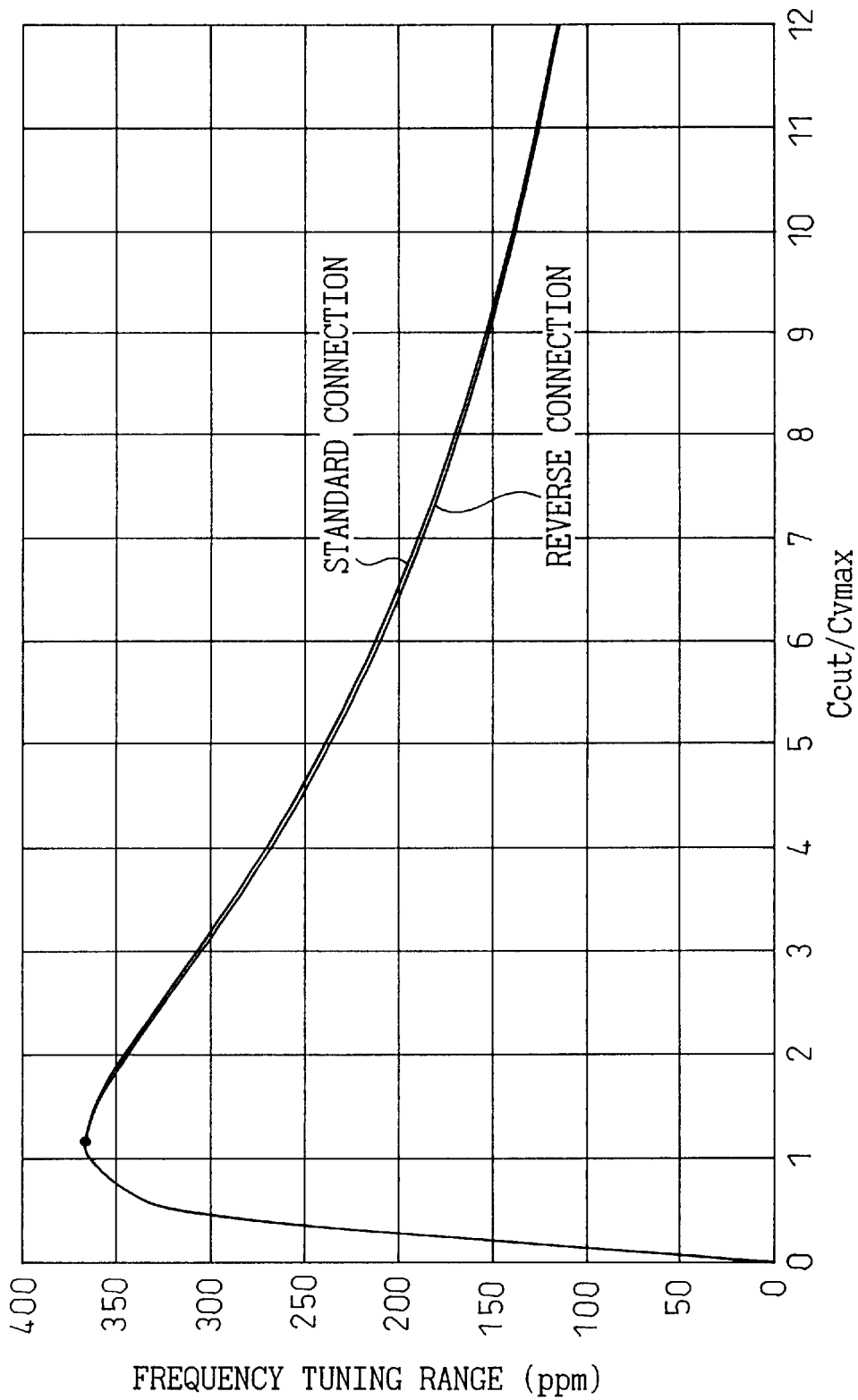
FIG. 13 is a graph showing the frequency tuning range of the crystal oscillator circuit as a function of the ratio Ccut/Cvmax, comparing the characteristic when the variable-capacitance element is connected to one electrode of a DC cut capacitor element with the characteristic when the variable-capacitance element is connected to the other electrode of the DC cut capacitor element.

FIG. 13 is a graph showing the characteristic when a reverse connection was employed, in comparison with the characteristic when the standard conditions were employed. The reverse connection refers to the state in which the metal wiring line 19 (see FIG. 2) is replaced by the metal wiring line 20 (indicated by dashed line in FIG. 2) which connect to the polysilicon film 17. Standard values are used for the other circuit elements. In this example, CL is expressed not by equation (2), but by equation (3) given below. The standard conditions (standard connection) refer to the state in which the polysilicon film 16 is connected by the metal wiring line 19. As shown in FIG. 13, the two curves essentially overlap each other (though the curve for the reverse connection remains slightly below the other), and no substantial differences were observed. This demonstrates that the effective Ccut/Cvmax ratio is relatively unaffected by the structure of the oscillator circuit IC.

$$2CL=(CV*\text{Cout})/(CV+\text{Cout})+Cp1+Cp2 \ldots (3)$$

The results of the simulation will be briefly summarized below.

(1) Though there are differences in frequency tuning range, the respective curves are similar to each other in shape, and there is no curve that has a distinctly different shape.

(2) Compared with the prior art, the frequency tuning range is dramatically improved in a range of Ccut/Cvmax values far smaller than the Ccut/Cvmax value of more than 10 employed in the prior art (except when the value of Ccut/Cvmax is smaller than about 0.3).

(3) On each curve, the peak of the frequency tuning range appears when the Ccut/Cvmax value is in the range of 0.7 to 1.8.

When all general conditions, such as reference frequency adjustment deviations, frequency deviations due to temperature, etc., are considered, the frequency stability of crystal oscillators is ±50 ppm as an industry standard. Accordingly, the voltage-variable crystal oscillator is required to have a frequency tuning range of 100 ppm or larger, except for special cases. Keeping this in mind, when the results of the simulation are studied, it can be seen that the above minimum requirement can be satisfied when the value of Ccut/Cvmax is more than 0.2 and not more than 10. However, even within this range, if the value of Ccut/Cvmax is extremely small, the crystal oscillator may be unfit as an actual product. The reason is that some degree of variation exists in capacitance values in actual products. That is, when the value of Ccut/Cvmax is extremely small, the frequency tuning range may vary greatly due to this variation. Considering this, it is preferable that the value of Ccut/Cvmax is set to not more than 0.5.

The width the frequency tuning range should be made, while securing the above-stated stability for the oscillator itself, differs depending on the application, but it is believed that if the frequency tuning range has a width of 100 ppm or larger, the oscillator can be used in almost all existing applications. Therefore, the frequency tuning range of 100 ppm or larger is a standard value for voltage-controlled oscillators. From each graph, it can be seen that the value of Ccut/Cvmax that can provide a frequency tuning range of 200 ppm or larger is in the range of 0.4 to 4.0. Here also, it is preferable that the lower limit value be 0.5 or larger for the reason explained above.

Further, when the value of Ccut/Cvmax is set to a value near the peak value of the curve in each graph, a frequency tuning range exceeding 250 ppm can be obtained. Each graph also shows that the peak of every curve lies within the range of Ccut/Cvmax values of 0.7 to 1.8. Further, when the value of Ccut/Cvmax is in the range of 0.7 to 1.8, a frequency tuning range of 256 ppm or larger is achieved in all the graphs, and this can be said to be the optimum condition for providing a wide frequency tuning range.

In the prior art, because voltage-controlled crystal oscillators having such a wide frequency tuning range have been possible only by using discrete components, the prior art has had the disadvantage that not only does the overall size of the oscillator becomes large, but also the cost is high since special components and circuit configuration have had to be used. In contrast, according to the present invention, a voltage-controlled oscillator can be provided that is compact and low cost and that has a wide frequency tuning range.

In the simulation described above, the value of each parameter was set within a range of values supposed to be available as standard. Accordingly, in the design and manufacture of an actual integrated circuit, using the value of Ccut selected from the above-stated range is very effective for obtaining a wide frequency tuning range. If a numeric value outside the above-selected range is input for each parameter, there occurs the possibility that the Ccut/Cvmax value for the peak value may differ from the above-stated value. However, from the fact that, in the above simulation, the curves in every graph were very similar to each other in shape, and that there were no curves that have distinctly different shapes, it can be deduced that even when a numeric value outside the above-selected range is input for each parameter, a wide frequency tuning range can be achieved if a Ccut/Cvmax value within the above-stated range is selected.

In the graph of FIG. 3, since the parameter (the value of Cvmax when Ccut/Cvmax is fixed) can be adjusted by only adjusting the area sizes of the variable-capacitance element and DC cut capacitor element, it can take an arbitrary value, unlike other parameters. However, with values outside the range shown in FIG. 3, a wide frequency tuning range cannot be obtained even at the peak value. It is therefore desirable that the value of Cvmax be set within the range of 15 pF to 50 pF shown in FIG. 3.

Furthermore, in the simulation described above, only a single parameter was varied for simplicity of explanation. Accordingly, if a plurality of parameters are varied from the standard conditions, there occurs the possibility that the frequency tuning range and the Ccut/Cvmax value for the peak value may differ from the above-stated values. However, from the fact that, in the above simulation, the curves in every graph were very similar to each other in shape, and that there were no curves that have distinctly different shapes, it can be deduced that even when a plurality of parameters are varied from the standard conditions, a wide frequency tuning range can be achieved if a Ccut/Cvmax value within the above-stated range is selected.

Based on the circuit configuration of FIG. 1(a), actual integrated circuits (test chips) were made by varying the conditions, and the frequency tuning range was measured on the completed integrated circuits. The measured results were in good agreement with the simulation results described above.

Figure 14:
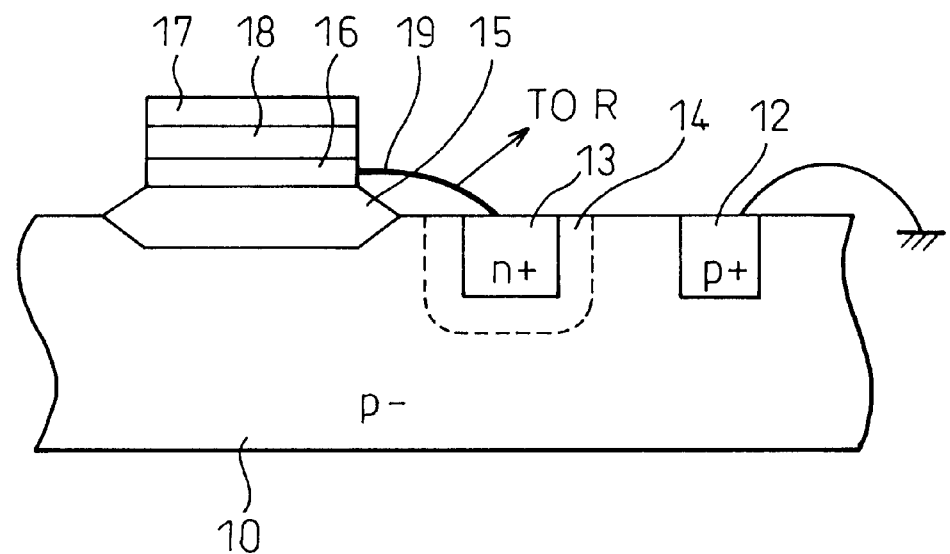
FIG. 14 is a cross-sectional view showing another example of the load capacitor portion of the integrated crystal oscillator circuit, which can also be used in one example of the embodiment of the present invention.

FIG. 14 shows a structural example of the variable-capacitance element, different from the structure shown in FIG. 2. A cross section of the IC structure of the variable-capacitance element portion is shown in FIG. 14. The variable-capacitance element shown in FIG. 14 is a varicap but, because the silicon substrate 10 is a p-substrate, the well is eliminated.

Figure 15:
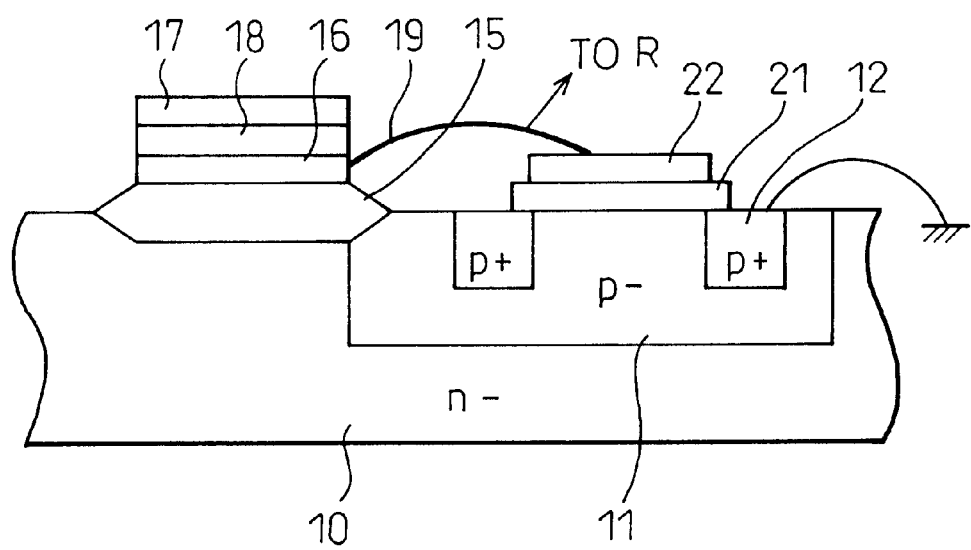
FIG. 15 is a cross-sectional view showing still another example of the load capacitor portion of the integrated crystal oscillator circuit, which can also be used in one example of the embodiment of the present invention.

FIG. 15 shows still another structural example of the variable-capacitance element. The variable-capacitance element shown in FIG. 15 is not a varicap, but a device called MOS-C in which gate capacitance of a MOS transistor is used as the variable capacitance. In FIG. 15, reference numeral 21 is an oxide film, and 22 is an electrode film. In the example of FIG. 15, an n-substrate is used, but use can also be made of a p-substrate.

In the examples of FIGS. 14 and 15, the DC cut capacitor element must also be provided; as a result, a parasitic capacitance associated with it exists. It is therefore clear that the present invention is likewise applicable to the examples of FIGS. 14 and 15.

An embodiment of the present invention has been described above, but it will be appreciated that the standard values for the circuit constants in the present invention or the equivalent circuit constants of the crystal are not limited to those illustrated in the above embodiment. Further, the corresponding circuit configuration and the integrated circuit structure are not necessarily limited to the configuration shown in FIG. 1 or the structure shown in FIG. 2. For example, there are a variety of crystals that differ in the cut or the mode of vibration, or that have two or more terminals, and there exist oscillator circuits optimum for the respective crystals. Basically, the present invention can be applied to any oscillator circuit of a configuration that controls the oscillation frequency by varying the voltage applied to a load capacitor. Since not only the crystal shown in the embodiment but other piezoelectric crystals can also be expressed by an equivalent circuit similar to the one shown in FIG. 1(b), the crystal shown in the present invention can be replaced by another piezoelectric crystal.

(1) According to the voltage-controlled crystal oscillator of the present invention, a frequency tuning range wider than that obtained in the prior art can be achieved by making the capacitance value of the integrated DC cut capacitor element smaller than the prior art. As a result, the voltage-controlled crystal oscillator of the present invention can be used in a wider variety of applications. Furthermore, because the area that the DC cut capacitor element occupies on the integrated circuit can be reduced, the voltage-controlled crystal oscillator of the present invention offers an enormous advantage in the fabrication and manufacture of crystal oscillators incorporating crystals.

(2) According to the voltage-controlled crystal oscillator of the present invention, by setting the value of Ccut/Cvmax within the range of 0.5 to 4.0, a frequency tuning range exceeding 200 ppm can be obtained even when the conditions are not optimum. (3) When the value of Ccut/Cvmax is set within the range of 0.7 to 1.8, the peak value of the frequency tuning range or a value close to the peak value can be obtained reliably, achieving the maximum frequency tuning range for the design. (4) When Cvmax is set within the range of 15 pF to 50 pF, it becomes possible to secure a wide frequency tuning range.

What is claimed is:

1. A voltage-controlled crystal oscillator comprising a crystal, an amplifier, and a load capacitor, wherein said load capacitor includes a voltage-controlled variable-capacitance element integrated on a semiconductor substrate and a DC cut capacitor element connected in series with said voltage-controlled variable-capacitance element, and said DC cut capacitor element has a capacitance value (Ccut) whose ratio to a maximum capacitance value (Cvmax) of said voltage-controlled variable-capacitance element (Ccut/Cvmax) is more than 0.5 and not more than 10.

2. A voltage-controlled crystal oscillator according to claim 1, wherein said ratio (Ccut/Cvmax) is more than 0.5 and not more than 4.0.

3. A voltage-controlled crystal oscillator according to claim 1, wherein said ratio (Ccut/Cvmax) is more than 0.7 and not more than 1.8.

4. A voltage-controlled crystal oscillator according to claim 1, wherein the maximum capacitance value (Cvmax) of said voltage-controlled variable-capacitance element is more than 15 pF and not more than 50 pF.

5. A voltage-controlled crystal oscillator according to claim 2, wherein the maximum capacitance value (Cvmax) of said voltage-controlled variable-capacitance element is more than 15 pF and not more than 50 pF.

6. A voltage-controlled crystal oscillator according to claim 3, wherein the maximum capacitance value (Cvmax) of said voltage-controlled variable-capacitance element is more than 15 pF and not more than 50 pF.

7. A voltage-controlled crystal oscillator according to claim 1, wherein said voltage-controlled variable-capacitance element is provided on an input side, as well as on an output side, of said amplifier.

8. A voltage-controlled crystal oscillator according to claim 1, wherein said voltage-controlled variable-capacitance element is provided only on one side, either an input side or an output side, of said amplifier, and said ratio (Ccut/Cvmax) is more than 0.7 and not more than 1.8.

* * * * *